United States Patent [19]

Burton et al.

[11] Patent Number: 5,523,941

[45] Date of Patent: Jun. 4, 1996

[54] X-Y-THETA POSITIONING MECHANISM

[76] Inventors: Gary L. Burton, 825 Las Gallinas Ave., Apt. 207, San Rafael, Calif. 94903; Paul J. Burton, 48 Newell Rd., Apt. 4, East Palo Alto, Calif. 94303

[21] Appl. No.: 317,570

[22] Filed: Oct. 4, 1994

[51] Int. Cl.[6] .................................................. G06F 19/00
[52] U.S. Cl. ...................... 364/167.01; 269/73; 318/135
[58] Field of Search ............................. 364/167.01, 559, 364/474.34, 474.37; 269/73, 71, 72; 108/20, 137, 143; 248/424, 425, 429, 430, 184, 416; 318/640, 625, 135; 356/358; 395/103; 33/1 M

[56] References Cited

U.S. PATENT DOCUMENTS

| | | | |
|---|---|---|---|
| 3,495,519 | 2/1970 | Alfsen et al. | 95/36 |
| 3,638,933 | 2/1972 | Burnette et al. | 269/60 |
| 3,884,580 | 5/1975 | Webster et al. | 356/106 R |
| 4,157,818 | 6/1979 | Key, Jr. | 269/73 |
| 4,191,916 | 3/1980 | Zasio et al. | 318/640 |
| 4,280,054 | 7/1981 | Guarino | 250/440 |
| 4,464,030 | 8/1984 | Gale et al. | 354/4 |
| 4,507,598 | 3/1985 | Wakabayashi et al. | 318/687 |
| 4,547,024 | 10/1985 | Teramachi | 308/6 C |
| 4,577,845 | 3/1986 | Kimura et al. | 269/73 |
| 4,589,746 | 5/1986 | Pauone | 354/4 |
| 4,610,442 | 9/1986 | Oku et al. | 269/73 |
| 4,667,139 | 5/1987 | Hirai et al. | 318/687 |
| 4,676,492 | 6/1987 | Shamir | 269/73 |
| 4,713,887 | 12/1987 | Kitamura | 33/1 M |
| 4,742,286 | 3/1988 | Phillips | 318/640 |
| 4,763,886 | 8/1988 | Takei | 269/73 |
| 4,774,442 | 9/1988 | Teramachi | 318/135 |
| 4,788,477 | 11/1988 | Teramachi | 318/135 |
| 4,812,725 | 3/1989 | Chitayat | 318/625 |
| 4,972,311 | 11/1990 | Holdgrafer et al. | 364/167.01 |
| 4,977,361 | 12/1990 | Phillips et al. | 318/640 |

OTHER PUBLICATIONS

"Accuracy in Positioning Systems" by Kevin McCarthy, Mar. 1991 p. 10, 9 error sources listed. Current invention solves all except #4.

*Primary Examiner*—Joseph Ruggiero

[57] ABSTRACT

An improved X-Y-θ positioning mechanism or stage having a rectangular platform (2) upon which a workpiece to be moved is placed. The platform is positioned by bearings (6a, 6b), which ride along its edges. In the preferred embodiment, the bearings are mounted to the ends of perpendicularly overlapping tracks (8x, 8y). The tracks are linearly movable via corresponding forcing elements or motor coils (10x, 10y). The forcing elements are fixedly mounted to a main structure (14), to dissipate heat efficiently. Also in the preferred embodiment, positioning feedback for the stage includes an X-Y scale (4). Position sensors (12a, 12b) are mounted fixedly to the main structure directly under the X-Y scale. θ rotation is achieved when two tracks are used for the same X or Y axis, so that the platform rotates as these two tracks are positioned slightly offset from one another.

20 Claims, 8 Drawing Sheets

X-Y-THETA POSITIONING MECHANISM

BACKGROUND

1. Field of Invention

This invention relates to positioning mechanisms or stages of high, medium, or low levels of accuracy, specifically to such stages designed for motion in at least two planar axes.

2. Description of Prior Art

Planar positioning stages are used in the silicon industry, machining, plotters, microscopes, assembly processes, microfilm, and many other applications.

Heretofore in recent history, the predominant designs in multi-axis planar positioning stages have been consistent in their approach, as illustrated in the following references:

"Accuracy in Positioning Systems" by Kevin McCarthy, 1991 U.S. Pat. No. 3,495,519 to Alfsen et al (1970)
U.S. Pat. No. 3,638,933 to Burnette et al (1972)
U.S. Pat. No. 3,884,580 to Webster et al (1975)
U.S. Pat. No. 4,157,818 to Key (1979)
U.S. Pat. No. 4,191,916 to Zasio et al (1980)
U.S. Pat. No. 4,280,054 to Guarino (1981)
U.S. Pat. No. 4,464,030 to Gale et al (1984)
U.S. Pat. No. 4,507,598 to Wakabayashi et al (1985)
U.S. Pat. No. 4,547,024 to Teramachi (1985)
U.S. Pat. No. 4,577,845 to Kimura et al (1986)
U.S. Pat. No. 4,589,746 to Pavone (1986)
U.S. Pat. No. 4,713,887 to Kitamura (1987)
U.S. Pat. No. 4,763,886 to Takei (1988)
U.S. Pat. No. 4,774,442 to Teramachi (1988)
U.S. Pat. No. 4,788,477 to Teramachi (1988)
U.S. Pat. No. 4,812,725 to Chitayat (1989)

STACKING

All of the above references suggest causing one means of linear motion to ride upon the motion of another, creating two stacked layers. When θ adjustment is necessary, the means of rotating the working surface can create a third layer in the stack.

One of the disadvantages of this stacking approach is that adjustment of any axis affects the positioning of the other axes which ride upon the axis being adjusted. This is partially because machined bearings and other parts can not achieve perfection in causing any motion to be truly linear. Further, the mechanical coupling between layers is often loose, creating additional misalignment. These effects are cumulative with each added axis of motion.

Another disadvantage of stacked positioning stages is that they do not allow for efficient heat dissipation from all of the forcing elements. Since some of the forcing elements move, it is difficult to attach a heat sink that would disperse heat to an area outside of an enclosure.

LASER INTERFEROMETERS

When high precision is needed, laser interferometers are usually used as the source of position feedback. The majority of the aforementioned references refer to the use of laser interferometers. Laser interferometers require a high level of precision in the manufacture of mirrors, prisms, and other reflective devices. They also require close monitoring of temperature, pressure, and humidity, since light behaves differently as these conditions change.

These factors add greatly to the cost of an installed system which uses laser interferometers. Also, as environmental conditions vary, and as reflective devices are never machined to perfection, actual performance is often less than desired.

UNCONVENTIONAL APPROACHES IN PRIOR ART

These problems have been partially addressed in U.S. Pat. No. 4,676,492 to Shamir (1987). This design is not stacked, and it uses linear scales as its means of positioning feedback. However, this design still has mechanical isolation between the linear scales and the working surface. Positioning errors can occur between lead screws and lead screw nuts, or at other points. These errors are not detected. This design also requires a footprint area much larger than would be required by the movement of the working surface itself. Further, it does not allow for θ rotation.

A more direct approach to resolving problems with stacking is illustrated in U.S. Pat. No. 4,742,286 to Phillips (1988). Here, a single, planar motion motor for movement in X, Y, and θ axes is used. However, this device is quite complicated, and it also uses laser interferometers.

U.S. Pat. No. 4,977,361, also to Phillips et al (1990) does not use an interferometer. The physical configuration of the stage itself is not specified. However, the positioning feedback mechanism is shown to project light through several parts, as is done in optical encoders. The feedback is limited by the resolution of the "addressing indicia." Due to the non-linearity of the feedback, it is not possible to interpolate between indicia to a very high resolution. Whereas, if the feedback were to form a consistent linear, monotonically varying pattern between the indicia, as with interferometers, diffraction gratings, or holograms, the feedback signal could be divided repeatedly to achieve a theoretically unlimited digital resolution.

U.S. Pat. No. 4,972,311 to Holdgrafer et al (1990) is not a stage design. Instead, it maps and records errors in existing stages. Using the information it derives, one can direct a stage to offset positions to compensate for consistent errors.

OBJECTS AND ADVANTAGES

Accordingly, the preferred embodiment of this stage has the following objects and advantages, providing:

(a) a stage which is simple and low cost, as compared with other stages which provide equal or less positioning accuracy;

(b) a stage with the potential for positioning resolution equal to that of interferometer-based stages, with a much simpler configuration;

(c) a stage in which motion about one axis does not create undetected errors in the other axes;

(d) a stage with a complete absence of positioning errors caused by mechanical looseness between the moving surface and the point of positioning feedback;

(e) a stage which has the potential for accuracy beyond that of current designs, due to the synergistic combination of above objects b through d;

(f) a stage which does not require special equipment to monitor and control temperature, pressure, or humidity;

(g) a stage with a simple and efficient means of dissipating heat from the forcing elements;

(h) a stage which has a total footprint area which is substantially the same as the area required by the motion of the working surface itself;

(i) a stage which can be very fast, due to the low inertia of the moving parts;

(j) a stage which can have a very low profile, due to the absence of stacked means of motion.

Further objects and advantages will become apparent from a consideration of the ensuing description and drawings.

DRAWING FIGURES

Figure 1:
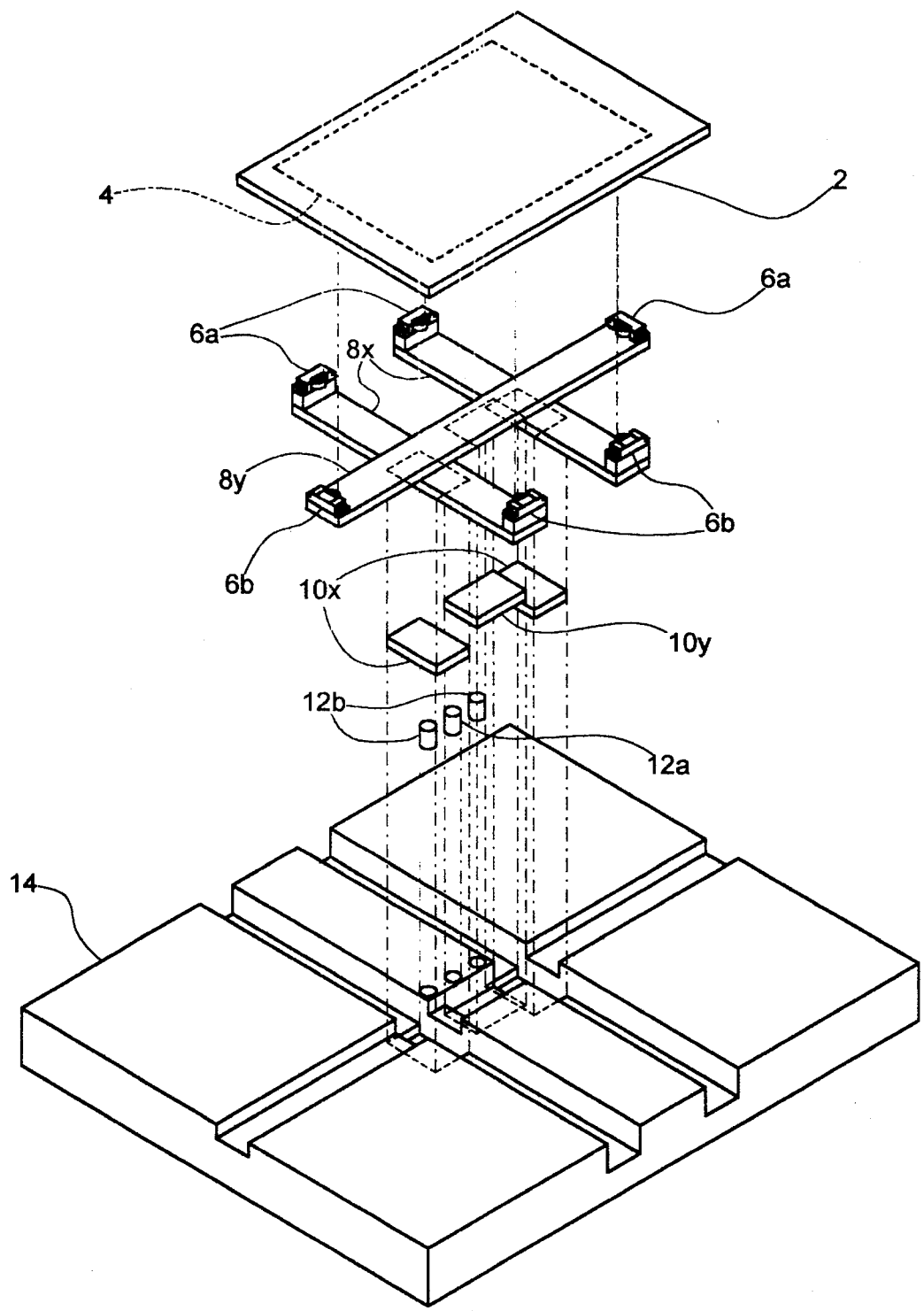
FIG. 1 is an exploded view of the preferred embodiment.

REFERENCE NUMERALS IN DRAWINGS 2 platform (working surface to be positioned)
4 X-Y scale (readable by position sensors in two axes)
6a positioning bearing assembly
6b preload bearing assembly
8x x-axis tracks
8y y-axis track
10x x-axis forcing elements
10y y-axis forcing element
12a dual-axis position sensor
12b single-axis position sensors
14 main structure
16 workpiece (supplied by user—not a part of this stage)
18 working head (supplied by user)
20 rotation base
21 rotating table (main structure 14 and base 20 combined)
22 rotation bearing assembly
24 rotation motor
26 rotation brake solenoids
28 linear scale (light-diffracting, magnetic, or other)
30 mirrors
32 laser interferometer beams
34 retroreflectors

DESCRIPTION OF THE PREFERRED EMBODIMENT—FIGS. 1, 2, 3a, 3b, 5

Figure 2:
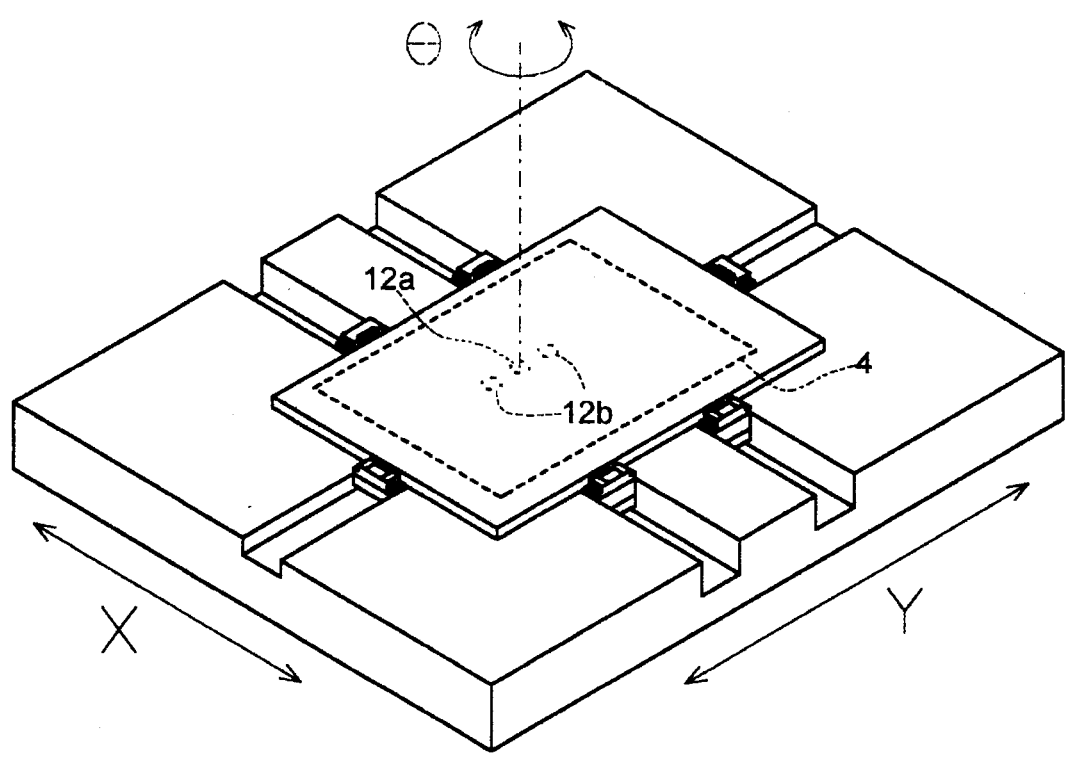
FIG. 2 is an assembled view of the preferred embodiment, showing each axis of motion.

The preferred embodiment of this stage is shown in FIG. 1 (exploded view) and FIG. 2 (assembled view). This stage has a platform 2 which forms the surface for the workpiece to be positioned. An x-y scale 4 is adhesively attached or embedded within the undersurface of platform 2.

X-Y scale 4 is a two dimensional diffraction grating. Grating lines of scale 4 face downward, and are arranged in two perpendicular axes, forming a grid pattern. A holographic scale which accomplishes this same task is available from Holograf of Santa Clara, Calif. The dimensions of scale 4 are equal to the desired range of motion.

Figure 3A:
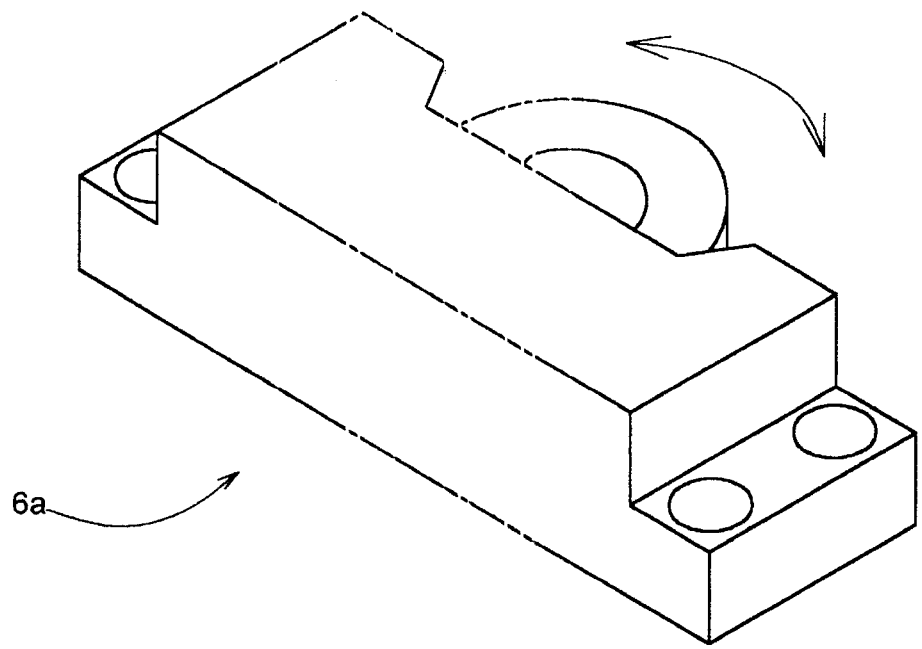
FIGS. 3a and 3b show detailed views of one embodiment of the platform edge bearings.
Figure 3B:
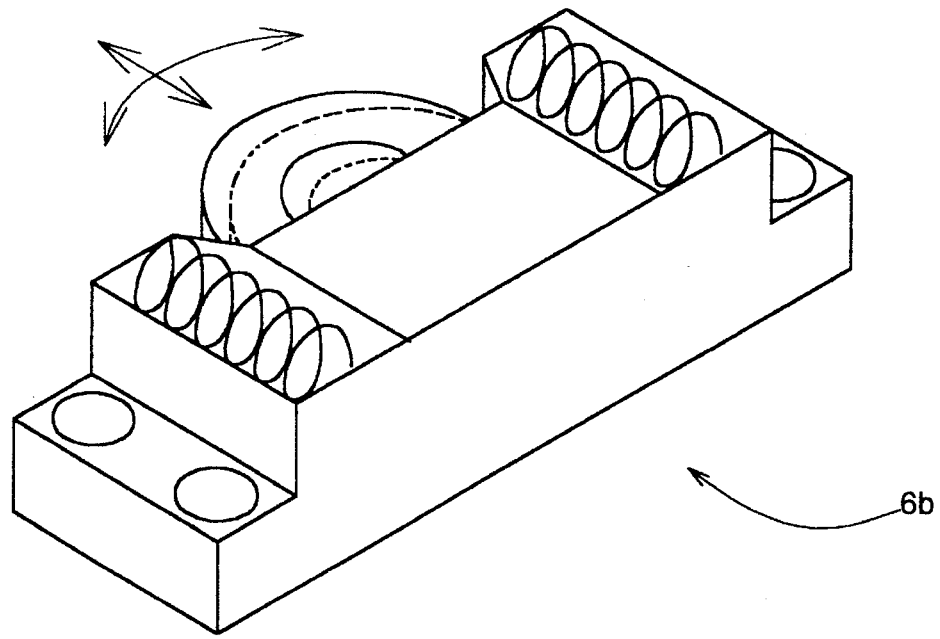

Platform 2 is held in place by positioning bearing assemblies 6a, and preload bearing assemblies 6b, which together surround and hold platform 2 at its edges. FIGS. 3a and 3b show detail of one embodiment of assemblies 6a and 6b. Each positioning assembly 6a is located at an opposite edge of platform 2 from a corresponding preload assembly 6b. With this arrangement, spring tension from preload assemblies 6b holds all bearing assemblies against the edges of platform 2.

Bearing assemblies 6a and 6b are mounted firmly to the ends of x-axis tracks 8x and a y-axis track 8y. Y-axis track 8y crosses over x-axis tracks 8x, but no track touches any other. X-axis tracks 8x have elevated portions at the ends, under assemblies 6a and 6b. These elevated portions have dimensions sufficient to enable all bearing assemblies 6a and 6b to contact platform 2 along a single plane.

Tracks 8x and 8y are largely comprised of the permanent magnet portions of brushless linear motors. Tracks 8x and 8y also have additional hardware to create the appropriate physical configuration. In addition to the elevated portions mentioned above, this includes extensions to the lengths of tracks, as needed.

X-axis forcing elements 10x and y-axis forcing element 10y are located directly under corresponding tracks 8x and 8y, held separate by a small gap, as described below. Forcing elements 10x and 10y comprise the coil portions of the brushless linear motors.

Forcing elements 10x and 10y are rigidly mounted to main structure 14. Conventional heat sinks (not shown) are configured to disperse heat from forcing elements 10x, 10y through the bottom of main structure 14.

Dual-axis position sensor 12a and single-axis position sensors 12b are rigidly mounted to main structure 14, pointing upward. When all parts are assembled position sensors 12a and 12b lie directly under platform 2, at locations which enable them to scan scale 4.

Conventional linear bearings (not shown) reside between tracks 8x, 8y and main structure 14. These bearings suspend tracks 8x and 8y away from forcing elements 10x and 10y, leaving only a small gap between these parts, so that magnetic fields in the linear motors would still be effective. The preferred embodiment uses PTFE bearings, but any other means or material could be used.

An additional means of reducing friction (not shown) between platform 2 and main structure 14 is used. The preferred embodiment uses three small PTFE buttons affixed to the top of main structure 14. These buttons make contact with the undersurface of platform 2. Air bearings, magnetic bearings, or other means and materials could also be used. Alternatively, bearing assemblies 6a and 6b could be constructed so that they suspend platform 2 away from main structure 14. With such configuration, no bearings would be necessary under platform 2.

Figure 5:
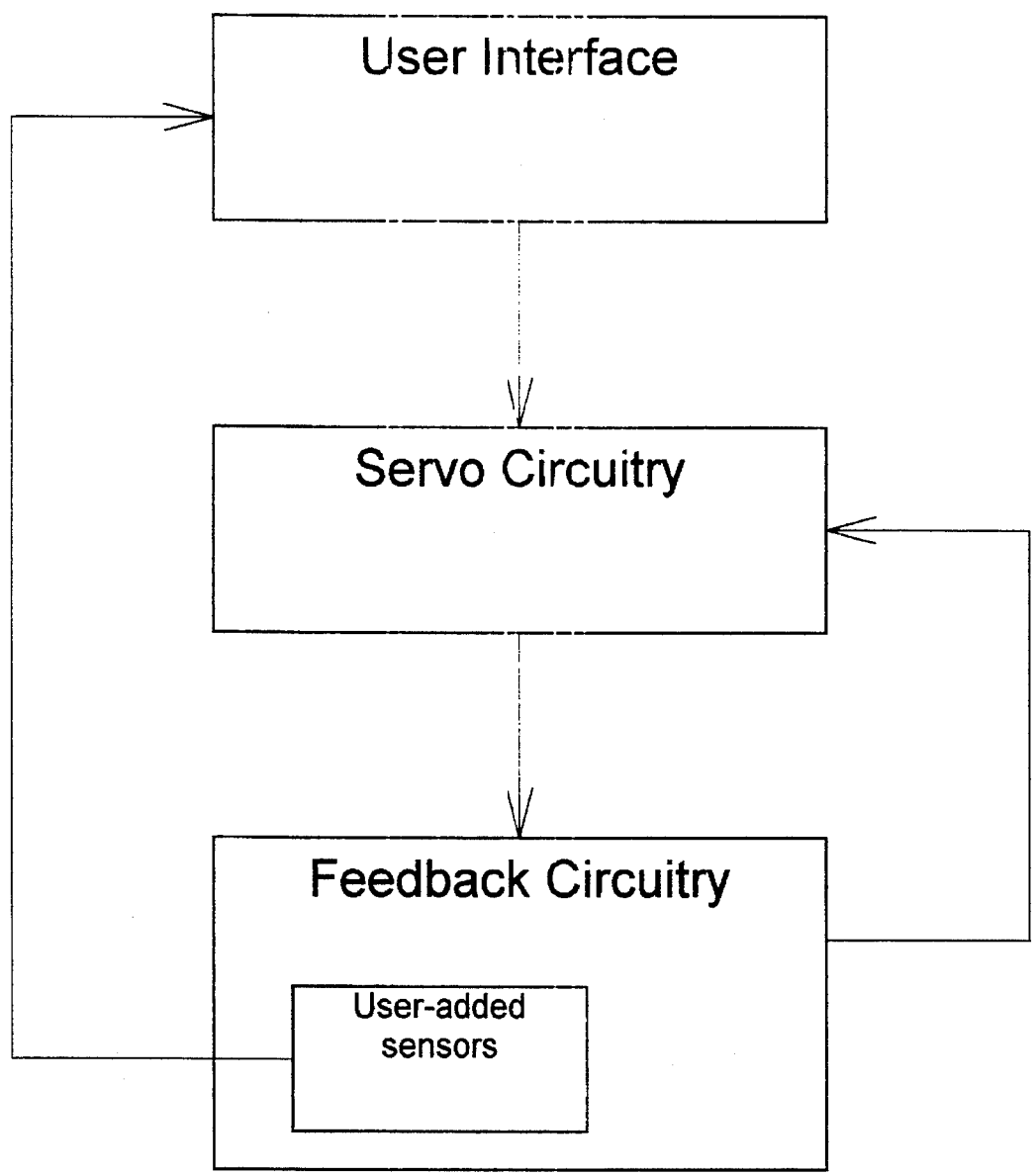
FIG. 5 shows a flowchart for the electronic circuitry required for the preferred embodiment.

Although electronic circuitry for this stage is not expressly specified nor claimed, the required function of electronics is shown in a flowchart in FIG. 5, and described under the following heading, "Operation."

OPERATION OF PREFERRED EMBODIMENT—FIGS. 2, 4, 5

Figure 4:
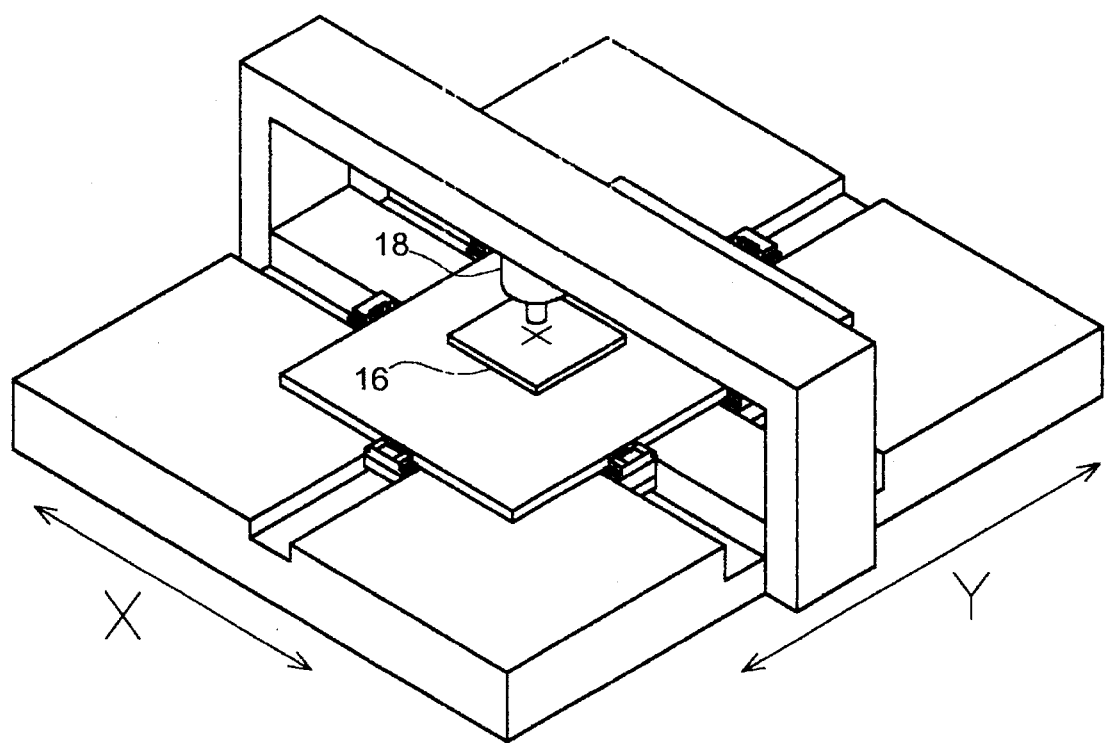
FIG. 4 shows a setup for the preferred embodiment in operation.

FIG. 4 shows this stage in use. Here, a workpiece 16 is placed on platform 2. Workpiece 16 is defined as a silicon wafer, a circuit board, a part to be machined, or any other item for which a task is to be done at specific points within the area of its horizontal profile.

Workpiece 16 may be anchored to platform 2 by any means determined by the user.

A working head 18 is held above workpiece 16. Working head 18 is defined as a microscope lens, a machine head, an E-beam projector, or any other means of performing a task with workpiece 16. Working head 18 is anchored rigidly to a structure determined by the user, such that it does not move in relation to main structure 14.

As shown in FIG. 5, the required electronics for the preferred embodiment include the following: three servo circuits to cause motion in forcing elements 10*x* and 10*y*, position detection feedback circuitry, and a user interface.

The user interface may include a means of storing several programmed series of movements. Further, each stored program may have alternative subprograms, which may be initiated upon feedback from other sensors or controls, as needed.

FIG. 2 shows the three axes of motion. To detect positioning, the grating lines of scale 4 are counted as they pass over position sensors 12*a* and 12*b*. Each sensor also has the ability to detect the direction of motion, so that positions are derived by adding and subtracting from each previously detected position.

The resolution of feedback is not limited by the resolution of the grating lines on scale 4. This is because the grating lines on scale 4 are detected by sensors 12*a* and 12*b* as a consistent, repeating analog sine wave as scale 4 passes over. Such a sine wave can be interpolated and divided an indefinite number of times by the servo circuitry. Therefore, as the subdivided analog feedback signal is converted to a digital output, a theoretically unlimited resolution can be achieved.

Dual-axis sensor 12*a* resides directly under working head 18, and defines the point of work. Sensor 12*a* counts the grating lines of scale 4 in both axes during motion. Sensor 12*a* provides feedback for all servo circuits, to position workpiece 16 directly under working head 18.

When sensors 12*a* and 12*b* all detect the same positioning in the x-axis, the θ offset is considered to be zero. Motion of x-axis tracks 8*x* will be generally the same. However, to achieve θ adjustment, each x-axis track 8*x* is driven independently.

Due to the constant feedback directly at the point of work, any errors caused by motion in various axes are instantly corrected.

The illustrated embodiment of this stage only allows for a few degrees of θ rotation. However, most users will only use the θ sensitivity to maintain a constant alignment with the two perpendicular axes. This stage can also be directed to rotate workpiece 16 slightly about the θ axis, if needed.

The reason for having two single-axis position sensors 12*b* is to enable a wider range of motion without requiring a large scale 4. As the edge of scale 4 draws near one sensor 12*b*, the first is disregarded, and the other sensor 12*b* gains control. In this way, scale 4 can be allowed to move away from either sensor 12*b* while still monitoring θ alignment.

Since each grating line of scale 4 is identical, position feedback is only relative to previous positions. A starting point or zero reference must therefore be established.

The starting point or zero reference must be relative to the placement of workpiece 16. One method of accomplishing this is to place workpiece 16 at a known, consistent position in relation to main structure 14. The position at that moment is then regarded as the zero reference.

DESCRIPTION AND OPERATION OF FULL ROTATION EMBODIMENT—FIG. 6

Figure 6:
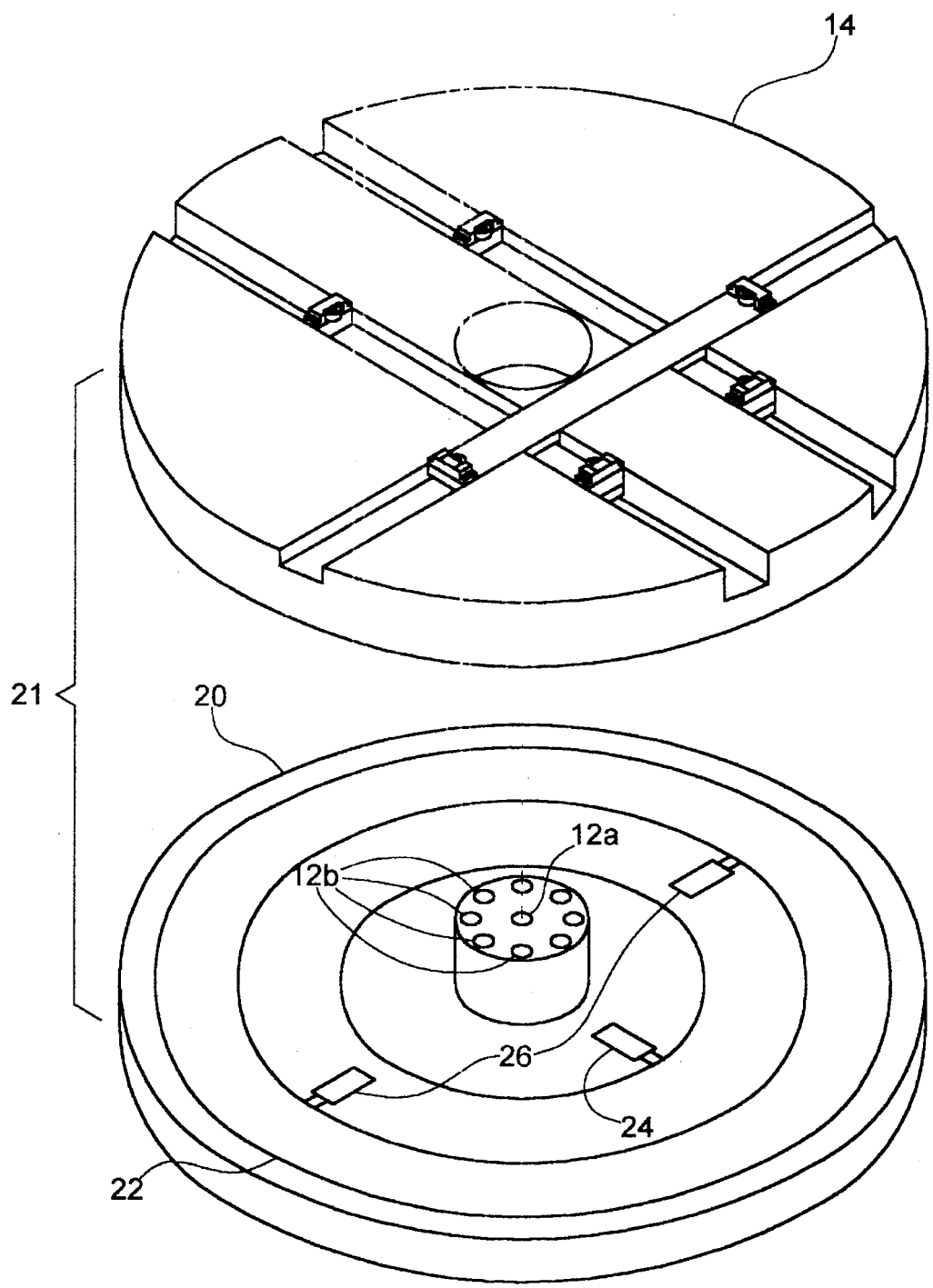
FIG. 6 shows an embodiment which allows complete $\theta$ rotation.

FIG. 6 shows another embodiment, which allows for full 360 degree rotation about the θ axis. Here, main structure 14 is supported on top of a rotation base 20. Together these two large parts form a rotating table 21. A large circle of standard bearings comprises rotation bearing assembly 22 to alleviate friction between main structure 14 and rotation base 20.

For complete θ rotation, a rotation motor 24 meshes with teeth (not shown) under main structure 14. Rotation motor 24 may be a stepper-type motor, since it is not intended to be the means of achieving angular precision. Once rotation motor 24 rotates main structure 14 to approximately the correct predetermined angle, rotation brake solenoids 26 engage to hold main structure 14 steady.

More precise θ adjustment is achieved in the same manner as with the preferred embodiment described above. However, a larger number of single-axis position sensors 12*b* are required. As shown in FIG. 6, sensors 12*b* are arranged in a circle, surrounding dual-axis position sensor 12*a*. Position sensor 12*a* still defines the point of work.

DESCRIPTION AND OPERATION OF LINEAR FEEDBACK—FIG. 7

Figure 7:
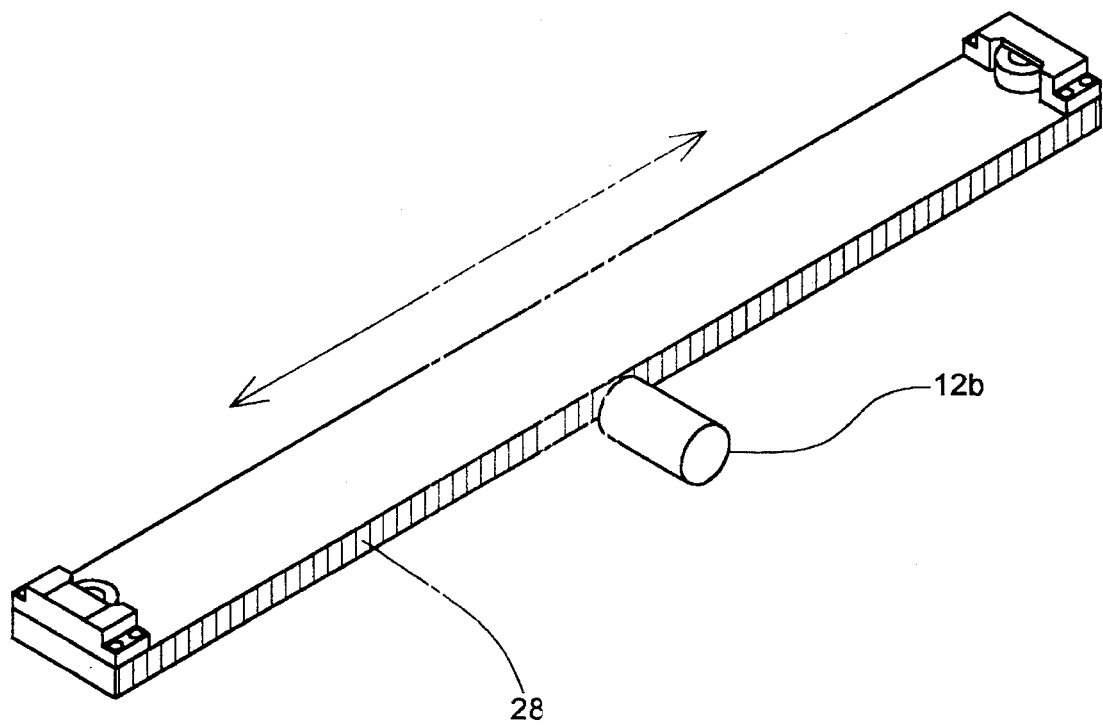
FIG. 7 shows the general configuration for using linear-type feedback devices.

As shown in FIG. 7, some embodiments may not use X-Y scale 4, but instead may use a linear scale 28 on each track. Scale 28 may use light-diffracting, magnetic, optical encoder or other means to interact with single-axis position sensors 12*b*, which remain stationary.

DESCRIPTION AND OPERATION OF USING LASER INTERFEROMETRY—FIG. 8

Figure 8:
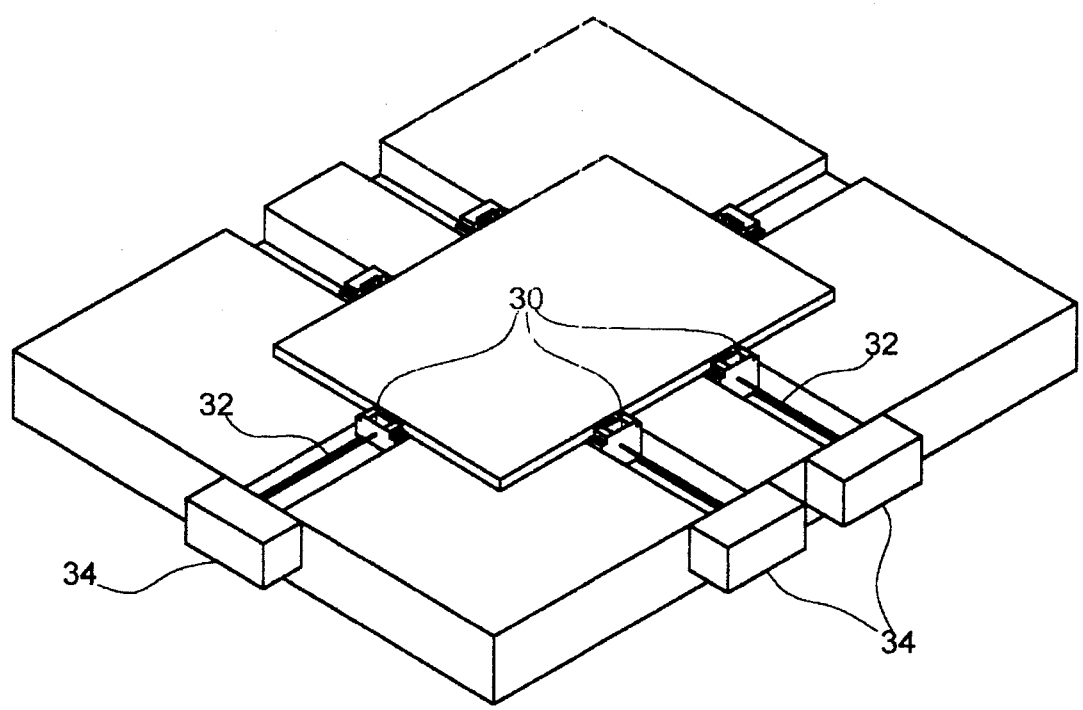
FIG. 8 shows an embodiment which uses laser interferometers.

FIG. 8 shows the general configuration for using laser interferometers as the means of feedback with this invention. In some situations, this may be advantageous over the preferred embodiment. For example, if a user is operating in a vacuum environment, laser interferometers do not require equipment to control temperature nor humidity. Further, if a user already has a laser interferometer system available, providing another means of feedback would be redundant.

For laser interferometry, the only parts necessary to add to the preferred embodiment are precision mirrors 30, which reside at the ends of each track. Everything else involved is part of standard interferometry equipment, which is not included as part of this stage. However, for illustration purposes, laser beams 32 are shown to reflect from mirrors 30, and return to the user's retroreflectors 34. Additional standard interferometry equipment is not shown, as it is also supplied by the user.

Mirrors 30 may be comprised of standard cube corner reflectors, rather than flat mirrors.

With this configuration, it is possible to detect positioning in X, Y and θ axes with interferometry. Since interferometers provide linear feedback, they are seldom used for feedback in the θ axis, except with very complex configurations in prior art.

SUMMARY, RAMIFICATIONS, AND SCOPE

Accordingly, the reader will see that this stage is generally simpler and lower cost than the majority of prior art, while still providing improved performance. Specifically, it has potential for greater speed, and improved accuracy. In addition, it provides an efficient means of dissipating heat. Also, its capability to operate without interferometers allows it to be used without costly equipment for monitoring and controlling environmental conditions.

The embodiments described above illustrate the general configuration and operation of the current invention. However, the three main ideas of this invention include a stage in which:

(a) all motor coils or forcing elements are mounted firmly to a main structure, under the point of work, to disperse heat efficiently and minimize the required footprint, and/or;

(b) a moving platform is positioned by linearly movable bearings which ride along surfaces perpendicular to the axis of motion of each bearing, and/or;

(c) feedback is obtained by direct comparison of the position of a platform, which is used as the working surface, and the position of the base or main structure of the stage.

Alternative embodiments include any or all of the above, and may include:

(a) using only one track, or many tracks, for each axis;

(b) using any alternative means of feedback, such as optical encoders, linear scales, magnetic scales, LVDT's, or eliminating the need for feedback entirely by operating in an open loop manner;

(c) using any other embodiment for positioning bearings and preload bearings which contact a platform at its edges and define its positioning;

(d) using any other means of linear motion, such as leadscrews or other types of motors, or even non-electromagnetic means, such as hydraulics;

(e) using several two dimensional scales in a tiled fashion, with a larger number of position sensors.

Thus the scope of the current invention should be determined by the appended claims and their legal equivalents, rather than by the examples given.

We claim:

1. A stage for moving a workpiece to positions within the horizontal profile of said workpiece, and along the same plane, comprising:

a rigid main structure;

a movable platform to hold said workpiece;

actuator means for moving said platform in relation to said main structure;

feedback means for detecting motion and position of said platform in relation to said main structure;

said actuator means having all forcing elements fixedly mounted directly to said main structure, within a footprint area defined by the horizontal range of motion of said platform;

whereby heat is efficiently dissipated, and the required footprint area for said stage is minimized.

2. The stage of claim 1, said feedback means comprising:

an X-Y scale being fixedly mounted to said platform;

said scale having grating lines thereon;

said grating lines being arranged in an orthogonal grid pattern;

said grating lines each having identical characteristics of interacting with light;

sensors to detect and interpolate said grating lines as said scale moves;

said sensors being fixedly mounted to said main structure;

whereby temperature, pressure, and humidity need not be controlled, and the potential for accuracy is improved.

3. The stage of claim 2, said feedback means further comprising;

a plurality of said scales;

said scales being arranged in a tiled pattern;

whereby the range of motion is not limited by the size of available scales.

4. The stage of claim 1, said feedback means being selected from a group consisting of;

interferometers;

optical encoders:

linear diffraction gratings;

magnetic scales;

linearly variable differential transformers;

whereby positioning accuracy and type of feedback are dependent on the needs of the user.

5. The stage of claim 1, said actuator means having a characteristic of open-loop operability, whereby said feedback means is made unnecessary.

6. The stage of claim 1, further including a rotating table and a rotation means for turning said rotating table, whereby complete rotation may be achieved.

7. The stage of claim 6;

said rotating table being located under said main structure;

said rotating table having a base which forms the undersurface of the entire stage;

said feedback means being configured to detect motion and positioning of said platform in relation to said base, rather than in relation to said main structure;

whereby detected positions from said feedback means remain relative to the undersurface of the stage itself.

8. A stage for moving a workpiece to positions within the horizontal profile of said workpiece, and along the same plane, comprising:

a rigid main structure;

a movable platform to hold said workpiece;

actuator means for moving said platform in relation to said main structure;

feedback means for detecting motion and position of said platform in relation to said main structure;

said platform having its positioning defined by bearings attached to said actuator means;

said platform having straight guide surfaces to contact said bearings, perpendicular to each corresponding said bearing's axis of motion; said guide surfaces' location of attachment to said platform being selected from a group consisting of the edges of said platform, beneath said platform, and above said platform;

each said bearing having a corresponding-preload means for maintaining said bearings' contact with said guide surfaces;

said preload means being attached to said actuator means;

whereby all moving parts have low inertia for improved speed performance.

9. The stage of claim 8, said feedback means comprising:

an X-Y scale being fixedly mounted to said platform;

said scale having grating lines thereon;

said grating lines being arranged in an orthogonal grid pattern;

said grating lines each having identical characteristics of interacting with light;

sensors to detect and interpolate said grating lines as said scale moves;

said sensors being fixedly mounted to said main structure;

whereby temperature, pressure, and humidity need not be controlled, and the potential for accuracy is improved.

10. The stage of claim 9, said feedback means further comprising;

a plurality of said scales;

said scales being arranged in a tiled pattern;

whereby the range of motion is not limited by the size of available scales.

11. The stage of claim 8, said feedback means being selected from a group consisting of;

interferometers;

optical encoders;

linear diffraction gratings;

magnetic scales;

linearly variable differential transformers;

whereby positioning accuracy and type of feedback are dependent on the needs of the user.

12. The stage of claim 8, said actuator means having a characteristic of open-loop operability, whereby said feedback means is made unnecessary.

13. The stage of claim 8, further including a rotating table, whereby complete rotation may be achieved.

14. The stage of claim 13;

said rotating table being located under said main structure;

said rotating table having a base which forms the undersurface of the entire stage;

said feedback means being configured to detect motion and positioning of said platform in relation to said base, rather than in relation to said main structure;

whereby detected positions from said feedback means remain relative to the undersurface of the stage itself.

15. A stage for moving a workpiece to positions within the horizontal profile of said workpiece, and along the same plane, comprising:

a rigid main structure;

a movable platform to hold said workpiece;

actuator means for moving said platform in relation to said main structure;

feedback means for detecting motion and position of said platform in relation to said main structure;

said platform comprising a single solid structure;

said feedback means having a first element fixedly mounted to the undersurface of said platform;

said feedback means further having a second element mounted fixedly to said main structure, centered directly under a predetermined point of work;

in combination, said first and second elements having a characteristic of interacting to produce electrical signals which represent position and motion of said first and second elements relative to each other;

in combination, said feedback means and said actuator means having the ability to detect and control angular alignment;

whereby feedback signals accurately represent positioning of said workpiece, without the possibility of containing errors caused by mechanical looseness between the point of feedback and the point of work.

16. The stage of claim 15, said feedback means comprising:

an X-Y scale being fixedly mounted to said platform;

said scale having grating lines thereon;

said grating lines being arranged in an orthogonal grid pattern;

said grating lines each having identical characteristics of interacting with light;

sensors to detect and interpolate said grating lines as said scale moves;

said sensors being fixedly mounted to said main structure;

whereby temperature, pressure, and humidity need not be controlled, and the potential for accuracy is improved.

17. The stage of claim 16, said feedback means further comprising;

a plurality of said scales;

said scales being arranged in a tiled pattern;

whereby the range of motion is not limited by the size of available scales.

18. The stage of claim 15, said feedback means being selected from a group consisting of;

optical encoders;

linear diffraction gratings;

magnetic scales;

linearly variable differential transformers;

whereby positioning accuracy and type of feedback are dependent on the needs of the user.

19. The stage of claim 15, further including a rotating table, whereby complete rotation may be achieved.

20. The stage of claim 17;

said rotating table being located under said main structure;

said rotating table having a base which forms the undersurface of the entire stage;

said feedback means being configured to detect motion and positioning of said platform in relation to said base, rather than in relation to said main structure;

whereby detected positions from said feedback means remain relative to the undersurface of the stage itself.

* * * * *